United States Patent [19]

Uehara et al.

[11] Patent Number: 4,637,691

[45] Date of Patent: * Jan. 20, 1987

[54] MIRROR CONVERGING-TYPE ILLUMINATION OPTICAL SYSTEM

[75] Inventors: Makoto Uehara, Tokyo; Sumio Hashimoto, Kawasaki, both of Japan

[73] Assignee: Nippon Kogaku K. K., Tokyo, Japan

[*] Notice: The portion of the term of this patent subsequent to Feb. 12, 2002 has been disclaimed.

[21] Appl. No.: 576,477

[22] Filed: Feb. 2, 1984

[30] Foreign Application Priority Data

Feb. 7, 1983 [JP] Japan .................................. 58-18697

[51] Int. Cl.$^4$ .............................................. G02B 21/06
[52] U.S. Cl. ..................................... 350/432; 350/523
[58] Field of Search .................................. 350/432, 523

[56] References Cited

U.S. PATENT DOCUMENTS 3,547,526 12/4970 Devereux ....................... 350/432
4,498,742 2/1985 Uehara .............................. 350/432

Primary Examiner—John K. Corbin
Assistant Examiner—Rebecca D. Gass
Attorney, Agent, or Firm—Shapiro and Shapiro

[57] ABSTRACT

A mirror converging-type illumination optical system for converging light rays from a light source into substantially parallel light rays using a concave reflecting mirror having a secondary curved surface comprises a conical refraction member having a convex conical refraction surface at an input or incident side thereof and another convex conical refraction surface at an output side thereof. The refraction member is arranged in a path of the parallel light rays with a vertex of the conical refraction member being substantially aligned with the optical axis of the illumination optical system. The refraction member inverts the inner and outer portions of the incident parallel light rays. The absence of incident parallel light around the optical axis thereof is corrected to achieve a uniform intensity of light rays.

9 Claims, 10 Drawing Figures

MIRROR CONVERGING-TYPE ILLUMINATION OPTICAL SYSTEM

BACKGROUND OF THE INVENTION

1. Field of the Invention

The present invention relates to an illumination optical system and, more particularly, to an illumination optical system including a reflecting mirror having a secondary curved surface such as an elliptical mirror.

2. Description of the Prior Art

In an illumination system using a discharge-type light source such as an ultra high-voltage mercury lamp, it is most effective to converge light by a secondary curved surface mirror such as an elliptical mirror or a spherical mirror. However, such a system is disadvantageous in that light rays are not present near the optical axis, providing an angle distribution wherein illuminating light rays are absent around the optical axis. When such a system is used for a microscope which forms an image of an object through an objective lens, light rays are absent at the center of the entrance pupil of the objective lens, providing an annular angle distribution. This means that peripheral light rays alone are used for an actual objective lens having slight aberration, which is not desirable. When the N.A. (numerical aperture) of the illuminating light is defined with respect to that of the objective lens, since the light rays are absent around the optical axis, the total amount of light obtainable is limited. When the N.A. of the illumination system is set such that the $\sigma$ value which is a ratio of the N.A. of the illumination system (condenser lens) to that of the objective lens and is given by:

$$\sigma = (\text{N.A. of illumination system})/(\text{N.A. of objective lens})$$

is slightly smaller than unity, optimum focal depth and resolution are obtained. Accordingly, in an illumination system of this type, in order to limit the N.A. of the illumination system as needed, the illuminating light rays must be shielded by an aperture stop at the periphery of the system where the light intensity is highest. This results in the fact that the effective illuminating light is significantly decreased. It is possible to use a condenser lens which has a short focal distance which matches the preset $\sigma$ value. However, an actual light source is not a point source and has a physical size. For this reason, when the focal distance is shortened, light rays which are to be collimated through the condenser lens form a predetermined angle with respect to the optical axis. The light rays are then partially shielded by the stop, resulting in light loss.

SUMMARY OF THE INVENTION

It is an object of the present invention to provide an illumination optical system of mirror converging-type, which has an improved light amount distribution and has a high efficiency.

There is provided according to the present invention a mirror converging-type illumination optical system for converging light rays from a light source and converting them into substantially parallel light rays using a concave reflecting mirror having a secondary curved surface, wherein a conical refraction member having a convex conical refraction surface at an input or incident side thereof and another convex conical refraction surface at an output or exit side thereof is arranged in a path of the parallel light rays with a vertex of the conical refraction member being substantially aligned with the optical axis of the illumination optical system. The refraction member inverts the inner and outer portions of the incident parallel light rays, and absence of incident parallel light around the optical axis thereof is corrected to achieve a uniform intensity of light rays.

DESCRIPTION OF THE PREFERRED EMBODIMENTS

Figure 1:
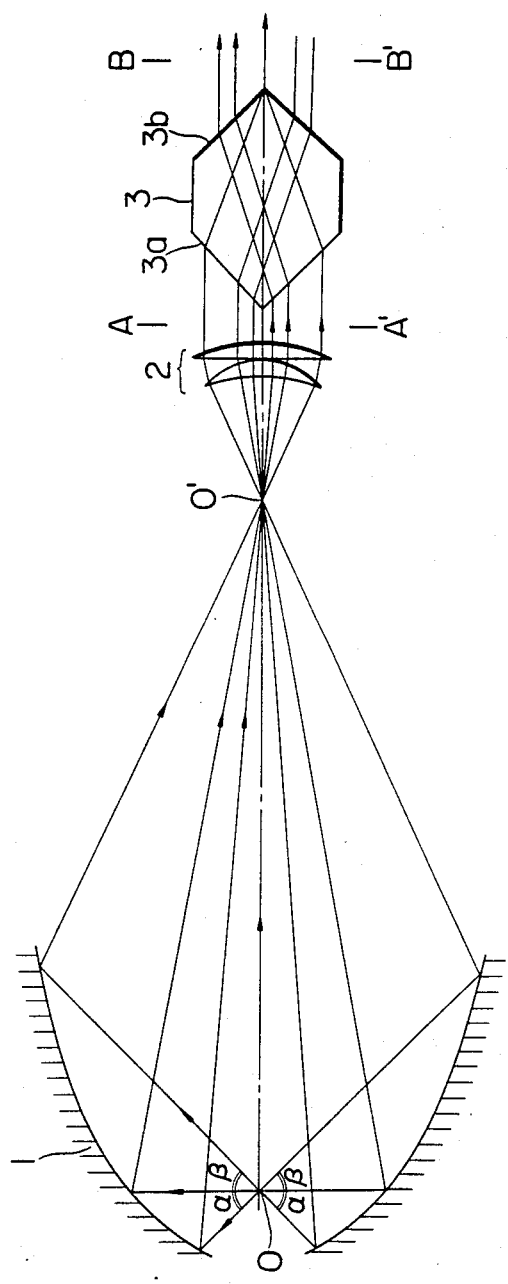
FIG. 1 is a view showing the optical path according to an embodiment of the present invention.
Figure 2:
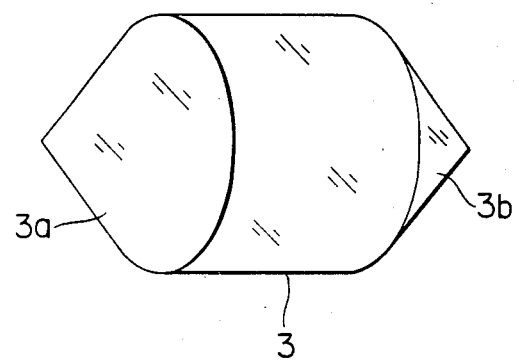
FIG. 2 is a perspective view of a conical prism used in the embodiment shown in FIG. 1.
Figure 3:
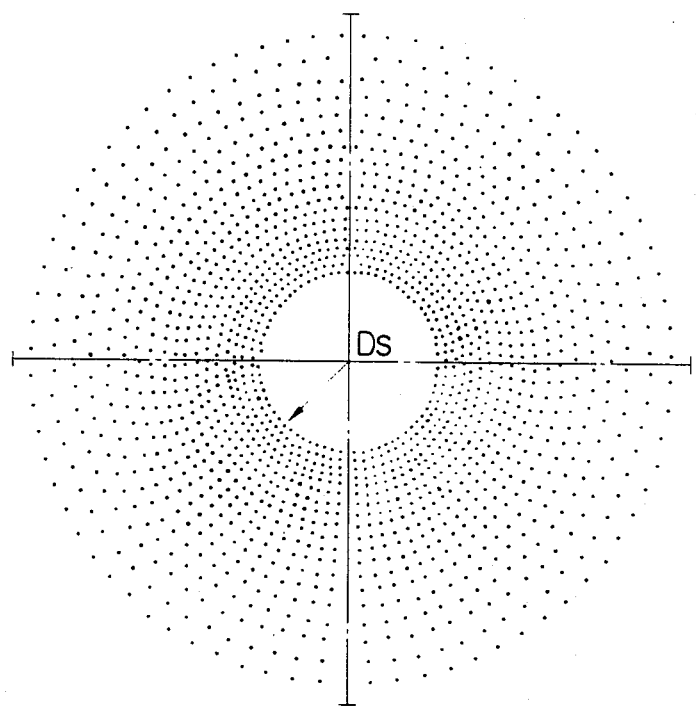
FIGS. 3 and 4 are spot diagrams for showing the light amount distribution according to the embodiment shown in FIG. 1.
Figure 4:
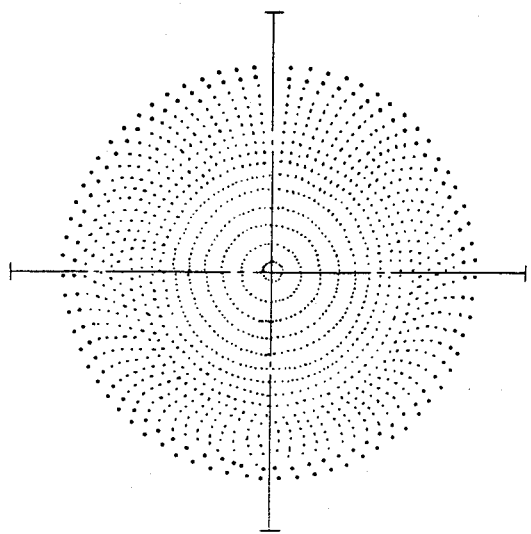

The preferred embodiments of the present invention will now be described with reference to the accompanying drawings. FIG. 1 is a view showing the optical path according to an embodiment of a first embodiment of the present invention. When a light source is arranged at one focal point 0 of an elliptical mirror 1, the light rays from the light source are converged at the other focal point 0', as is well known. The light rays are collimated into parallel light rays by a condenser lens 2. A conical prism 3 having convex conical surfaces as first and second surfaces 3a and 3b is arranged behind the condenser lens 2. FIG. 2 is a perspective view of the conical prism 3. The first surface 3a as the input or incident surface and the second surface 3b as the output or exit surface are both convex conical surfaces. The portion of the conical prism 3 which is interposed between the first and second surfaces 3a and 3b is a columnar part. The cones of the two conical surfaces 3a and 3b have the same vertex angle and are polished smoothly. As shown in the optical path view in FIG. 1, the parallel light rays from the condenser lens 2 are refracted inward by the first surface 3a of the conical prism 3 and are converted into the parallel light rays by the second surface 3b again. During this operation, the conical prism 3 shifts the incident parallel light rays which are farthest from the optical axis to the positions substantially coinciding with the optical axis, and shifts the incident parallel light rays which are nearest to the optical axis to the positions substantially farthest from the optical axis. Accordingly, the inward and outward portions of the incident light rays are inverted by the conical prism 3, such that the light rays produced from the conical prism 3 are dense light rays having no absent portion on and around the optical axis. For example, as shown in FIG. 1, assume that light rays are uniformly radiated from a point source at the focal point 0 at equal angles ($\alpha=\beta=45°$) with respect to a plane perpendicular to the optical axis. The spot diagram at a plane including a line A—A' immediately before the light rays become incident on the conical prism 3 is as shown in FIG. 3. The spot diagram at a plane including a line B—B' after the conical prism 3 is as shown in FIG. 4. That is, before the light rays are incident on the conical prism 3, no light rays are present in a circle having a radius Ds and the light amount distribution thus has a circular absent portion. However, after the light rays have passed through the conical prism 3, they have a substantially uniform light amount distribution wherein the central absent portion is eliminated.

Figure 5:
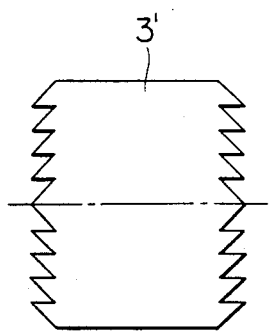
FIG. 5 is a sectional view showing another example of a conical prism.

The conical prism 3 need not be limited to that of the embodiment described above and can be split into two prisms. For example, a similar effect may be obtained with two prisms each having a flat surface and a convex conical surface. It is apparent that if such split prisms are used, the light path length in the prisms becomes shorter, the transmittance is increased, and the light amount loss is smaller. Furthermore, a similar effect can also be obtained if the conical prism 3 is a Fresnel prism 3', as shown in the section of FIG. 5.

The above embodiment is described with reference to a case wherein the light source is an ideal point source. Referring to FIG. 1, light rays which emerge from the point source at the angle $\beta$ pass through the condenser lens 2 as light rays which are farthest from the optical axis, due to the outer diameter stop of the elliptical mirror 1 and the directivity of the light source. These light rays are incident on the conical prism 3 as rays parallel to the optical axis at a height $H_0$, are refracted inward by the first surface 3a, cross the optical axis and are refracted inward again by the second surface 3b, as shown in detail in FIG. 6. As a result, the output light rays emerge from the conical prism 3 as parallel rays at a height $H_1$, thus providing generally a shift amount $\Delta h = H_0 - H_1$. In the embodiment shown in FIG. 1, light rays which are incident at the positions of the conical prism 3 which are farthest from the optical axis are converted into light rays which coincide with the optical axis. In this case, $H_1 = 0$ and $\Delta h \times H_0$. However, in practice, a light source has a physical size and not all of the light rays which are incident on the conical prism 3 are parallel light rays. In the case of a point source, it is preferable that $\Delta h = H_0$. However, considering an actual light source having a physical size and the relationship between an illuminated region and the o value described above, it is preferable that the following relation is satisfied:

$$(\tfrac{2}{3})H_0 \leq \Delta h \leq (3/2)H_0 \quad (1)$$

Figure 6:
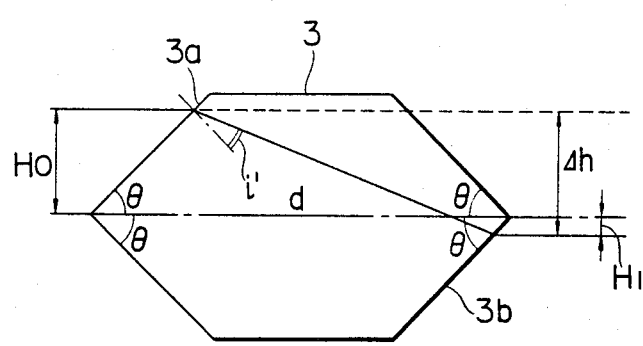
FIG. 6 is a view for explaining the conical prism shown in FIG. 1.

When only light rays which are parallel to the optical axis are considered, a correction amount is too small if the condition of the left side is satisfied and the correction amount is too large if the condition of the right side is satisfied. However, when an actual light source having a physical size is considered, no absent portion is obtained in the light amount distribution and good illumination light is obtained if the above relation is satisfied. A conical prism which satisfies these conditions will now be described. As shown in FIG. 6, when the shift amount of parallel light rays is designated by $\Delta h$, half of a vertex angle of each cone is designated by $\theta$, the refractive index of the prism is designated by n, and the distance between the vertices of both cones is designated by d, the shift amount $\Delta h$ is given by:

$$\Delta h = d/\{\tan(\theta+i') + 1/\tan\theta\} \quad (2)$$

where $i'$ is the angle of refraction and is given by:
$i' = \sin^{-1}\{\sin(\pi/2 - \theta)/n\}$
Accordingly, if the light source is an ideal point source, the condition $\Delta h = H_0$ must be satisfied. Therefore, from equation (2), the conical prism must satisfy the equation below:

$$d \; 32 \; H_0\{\tan(\theta+i') + 1/\tan\theta\} \quad (3)$$

In practice, considering the size of the light source, it is preferable that the following relation is satisfied:

$$(2/3)H_0\{\tan(\theta+i') + 1/\tan\theta\} \leq d \leq (3/2)H_0\{\tan(\theta+i') + 1/\tan\theta\} \quad (4)$$

for $i' = \sin^{-1}\{\sin(\pi/2 - \theta)/n\}$

When a conical prism satisfying this relation is used, problems of absence of light around the optical axis and loss of light are eliminated even for an actual light source having a given size.

Figure 7:
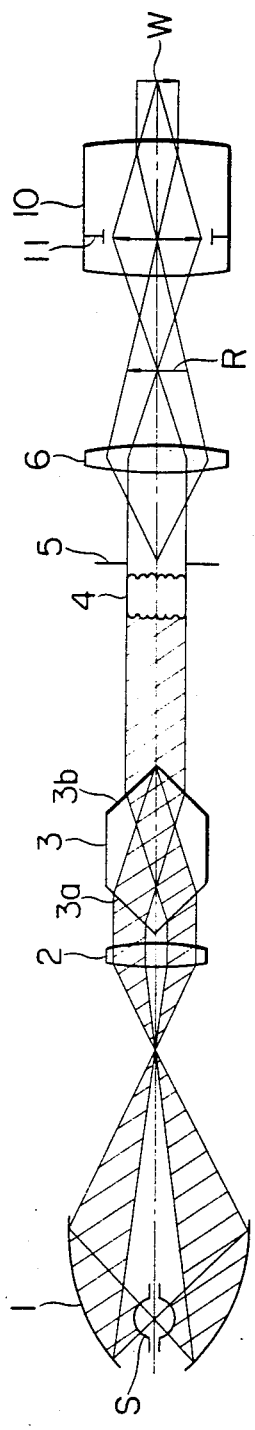
FIG. 7 is a view showing the configuration of a second embodiment of the present invention.
Figure 8:
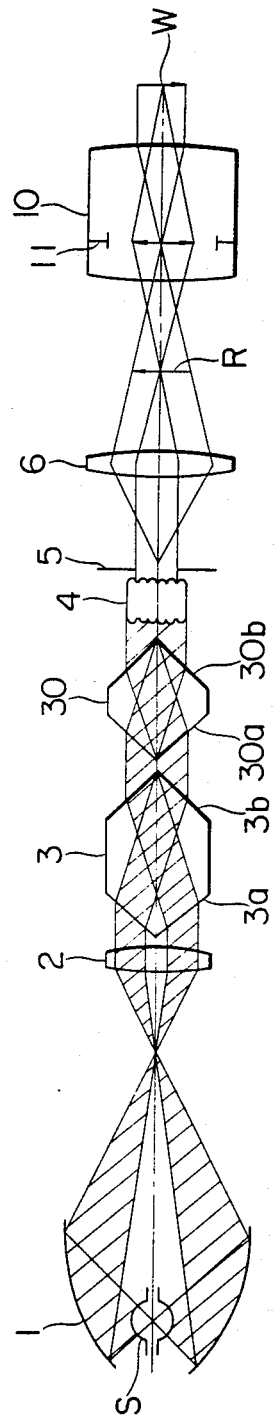
FIG. 8 is a view showing the configuration of a third embodiment of the present invention.
Figure 9:
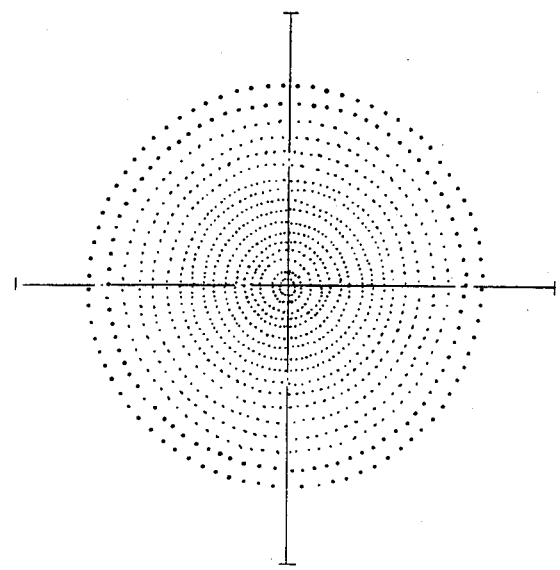
FIG. 9 is a spot diagram showing the light amount distribution according to the third embodiment shown in FIG. 8.
Figure 10:
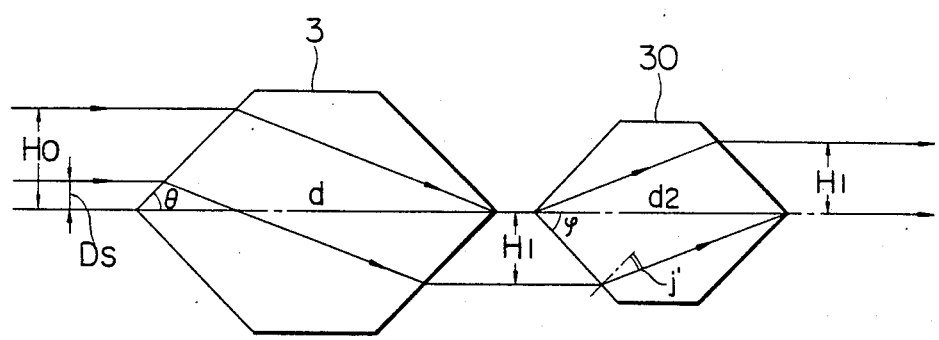
FIG. 10 is a view showing the mode of operation of the third embodiment.

FIG. 7 is a view showing the configuration of a second embodiment wherein an illumination optical system according to the present invention is applied to a projection-type exposure apparatus. Referring to FIG. 7, light rays from a light source S are converged by an elliptical mirror 1 and are collimated into substantially parallel light rays by a first condenser lens 2. The parallel light rays are passed through a refraction member 3 having convex conical surfaces 3a and 3b and reach an optical integrator 4 comprising a group of flyeye lenses. The light rays from the light source S to the optical integrator 4 are shown hatched. As may be seen from FIG. 7, substantially no light rays are present at the center around the optical axis at the output side of the first condenser lens 2. After the light rays are passed through the conical refraction member 3, they are symmetrically shifted toward the optical axis to provide substantially uniform light rays with no light ray absent portion near the optical axis. As disclosed in Japanese Laid-open Patent Application No. 56-81813, the optical integrator serves to form a plurality of secondary light sources. An aperture stop 5 is arranged near the exit surface of the optical integrator. The light rays which emerge from the aperture stop 5 illuminate a reticle R as an object to be illuminated through a second condenser lens 6. An image of the reticle R is projected by a projection objective lens 10 on a wafer W at a predetermined magnification. Note that the aperture stop 5 and an entrance pupil 11 of the projection objective lens 10 are conjugated with respect to the second condenser lens 6, thus achieving Köhler illumination. When an aperture diameter of the entrance pupil of the projection objective lens 10 is $\phi e$ and the size of an image of the aperture stop 5 formed at this position is $\phi a$, the $\sigma$ (sigma) value is given as $\phi a/\phi e$. Thus, the $\sigma$ value can be changed by changing the size of the aperture stop 5 by a means (not shown), and an optimal $\sigma$ value can be obtained by a pattern of the reticle. When the illumination optical system of the present invention is used in this manner, uniform light rays with no light ray absent portion can be projected onto the pupil of the projection objective lens 10. Accordingly, good performance of the projection objective lens can be achieved, and the pattern on the reticle can be clearly projected and printed onto the wafer. However, depending upon the pattern on the reticle, the $\sigma$ value must be rendered rather small and the peripheral light rays must be shielded by the aperture stop 5. In this case, the state of the light rays which emerge from the conical prism 3 and which become incident on the optical integrator 4 is uniform as seen from the spot diagram shown in FIG. 4. However, since the inner and outer light rays are inverted with respect to the optical axis by the conical prism 3, a decrease in the aperture stop diameter leads to shielding of outer light rays which have a relatively high intensity. This gives rise to a problem of a low efficiency of light. An illumination optical system according to a third embodiment of the present invention as shown in FIG. 8 solves this problem. The same reference numerals as in FIG. 7 denote the same parts in FIG. 8. As in the case of FIG. 7, the light path from a light source S to an optical integrator 4 is shown. In addition to a conical prism 3 used in the former embodiment, this embodiment has a second conical prism 30 at the output side of the conical prism 3. The second conical prism 30 also has convex conical surfaces 30a and 30b at its incident and output sides, respectively. In accordance with the same function as that of the first conical prism 3, the parallel beams incident to the second conical prism 30 are converted into parallel light rays wherein inner and outer light rays are inverted. Since the light rays incident on the second conical prism 30 have already been corrected for the light ray absent portion by means of the first conical prism, the second conical prism 30 need only invert the light rays with respect to the optical axis. Accordingly, the distance between the vertices of the conical surfaces 30a and 30b of the second conical prism 30 can be smaller than that of the first conical prism 3. According to the construction of this embodiment, the inner and outer light rays which have been inverted once with respect to the optical axis by the first conical prism 3 are reinverted by the second conical prism 30. For this reason, light rays converged by the elliptical mirror 1 which have a highest intensity can be supplied near the optical axis. The distribution of the light rays which have passed through the two conical prisms 3 and 30 is as shown in the spot diagram of FIG. 9. The spot diagram shown in FIG. 9 is obtained under the same conditions as for the spot diagram shown in FIGS. 3 and 4. It is then seen from a comparison of the diagram shown in FIG. 4 wherein only one conical prism is used with that shown in FIG. 9, that in FIG. 9 the light intensity at the center is further increased and a dense light distribution is provided. Accordingly, as shown in FIG. 8, even if the aperture stop 5 is decreased in diameter, intense light rays are not shielded, and an illumination with an optimum efficiency can be achieved. FIG. 10 is a view showing the relationship between the first conical prism 3 and the second conical prism 30. As described with reference to FIG. 6, the shift amount $\Delta h$ of light rays before and after passage through a conical prism is generally given as equation (2). The basic condition of the first conical prism 3 is to satisfy $\Delta h = H_0$ and relation (3) in practice. The shift amount $\Delta h$ of the light rays before and after passage through the second conical prism 30 in this embodiment can be smaller than that of the first conical prism 3 by a radius Ds of the light ray absent circular portion and can be given by:

$$\Delta h = H_0 - Ds$$

When half of the vertex angle of the second conical prism 30 is designated by $\phi$, the distance between the vertices of the cones is designated by $d_2$, and the refractive index is designated by $n_2$, the following relation must be satisfied:

$$d_2 = (H_0 - Ds)\{\tan(\phi + j') + 1/\tan\phi\} \quad (5)$$

for $j' = \sin^{-1}\{\sin(\pi/2 - \phi)/n_2\}$ where $j'$ is the angle of refraction of the second conical prism. However, in practice, a light source has a physical size and some light rays are not parallel to the optical axis. Accordingly, the following relation is preferably satisfied:

$$(2/3)(H_0 - Ds)\{\tan(\phi + j') + 1/\tan\phi\} \leq d_2 \leq (3/2)(H_0 - Ds)\{\tan(\phi + j') + 1/\tan\phi\}$$

It is apparent that the manufacturing cost is decreased if the first conical prism 3 and the second conical prism 30 are made of the same material and the same vertex angle of cones. Although an elliptical mirror is used in the above embodiments, the present invention is not limited to this. A parabolic mirror can be used. When a parabolic mirror is used, parallel light rays can be obtained when a light source is arranged at a focal point of the parabolic mirror used. Such a mirror also forms a light ray absent portion at the center. However, the light ray distribution can be rendered uniform by a conical prism such as that used in the above embodiments.

According to the present invention, in a mirror converging-type illumination optical system for supplying substantially parallel light rays by a reflecting mirror having a secondary curved surface such as an elliptical mirror, the light ray absent portion formed upon light conversion by the mirror is corrected by the equidirectional refraction of a conical prism, so that efficient illumination can be performed. If an optical integrator and a conical prism are combined to provide a projection-type exposure illumination system, illumination can be performed with a stable, high efficiency even if the illumination state is changed by control of an aperture stop.

We claim:

1. An illumination optical system for supplying substantially uniform illumination light of a high efficiency, comprising:
   a light source;
   light-ray converting means for converting light rays from said light source into parallel light rays, said light-ray converting means having a concave reflecting surface which has an optical axis; and
   a refraction member arranged in a path of the parallel light rays, so that said refraction member shifts the incident parallel light rays which are farthest from the optical axis to positions substantially coinciding with the optical axis, and shifts the incident parallel light rays which are nearest to the optical axis to positions substantially farthest from the optical axis, said refraction member having a conical input surface having a convex surface facing toward an incident light ray side and a conical output surface having a convex surface facing toward an exit light ray side, vertices of said conical input and output surfaces being located on the optical axis.

2. A system according to claim 1, wherein a vertex angle of said conical input surface of said refraction member is equal to a vertex angle of said conical output surface of said refraction member, said refraction member refracting inward incident light rays which are incident on said conical input surface and thereafter refracting the light rays at said conical output surface, thereby producing the light rays parallel to the incident light rays.

3. A system according to claim 2, wherein said refraction member has a prism with two convex conical surfaces.

4. A system according to claim 3, wherein when a distance between the vertices of the conical input and output surfaces is d, half the vertex angle of said conical surfaces is $\theta$, a refractive index of said prism is n, and a distance from the optical axis of light rays among the parallel light rays incident on said prism which are farthest from the optical axis is $H_0$, the following relation is satisfied:

$$(\tfrac{1}{3})H_0\{\tan(\theta+i')+1/\tan\theta\} \leq d \leq (3/2)H_0\{\tan(\theta+i')+1/\tan\theta\}$$

for $$i' = \sin^{-1}\{\sin(\pi/2-\theta)/n\}$$

where i' is an angle of refraction at said conical surfaces.

5. A system according to claim 4, further comprising an optical integrator arranged in the path of the parallel light rays emerging from said refraction member.

6. An illumination optical system for supplying substantially uniform illumination light of a high efficiency, comprising:
a light source;

7. A system according to claim 6, wherein a distance between verticles of cones having the conical surfaces in said second prism member is smaller than that in said first prism member.

8. A system according to claim 7, wherein when the distance between the vertices of the cones having the conical surfaces in said first prism member is d, half the vertex angle of the cones having the conical surfaces of said first prism member is $\theta$, a refractive index of said first prism member is n, and a distance from the optical axis of light rays among the parallel light rays incident on said first prism member which are farthest from the optical axis is $H_0$, the following relation is satisfied:

$$(\tfrac{1}{3})H_0\{\tan(\theta+i')+1/\tan\theta\} \leq d \leq (3/2)H_0\{\tan(-\theta+i')+1/\tan\theta\}$$

for $$i' = \sin^{-1}\{\sin(\pi/2-\theta)/n\}$$

where i' is an angle of refraction of the conical surfaces of said first prism member.

9. A system according to claim 8, wherein when a distance between the vertices of the cones having the conical surfaces in said second prism member is d2, half the vertex angle of the cones having the conical surfaces of said second prism member is $\phi$, and a refractive index of said second prism member is n2, the following relation is satisfied:

$$(\tfrac{1}{3})(H_0-D_s)\{\tan(\phi+j')+1/\tan\phi\} \leq d_2 \leq (3/2)(H_0-D_s)\{\tan(\phi+j')+1/\tan\phi\}$$

for $j' = \sin^{-1}\{\sin(\pi/2-\phi)/n\}$ where j' is an angle of refraction of the conical surfaces of said second prism member.

* * * * *